United States Patent [19]
Takeda et al.

[11] Patent Number: 5,494,711
[45] Date of Patent: Feb. 27, 1996

[54] METHOD OF PREPARING INSB THIN FILM

[75] Inventors: Toshikazu Takeda; Yoshifumi Ogiso; Takuji Nakagawa; Atsuo Senda, all of Nagaokakyo, Japan

[73] Assignee: Murata Manufacturing Co., Ltd., Japan

[21] Appl. No.: 180,127

[22] Filed: Jan. 11, 1994

[30] Foreign Application Priority Data

Jan. 12, 1993 [JP] Japan .................................. 5-003395

[51] Int. Cl.$^6$ ................ B05D 1/04; B05D 1/36; H05C 1/00; B06B 1/00
[52] U.S. Cl. .................. 427/473; 427/475; 427/560; 427/601; 427/561; 427/566; 427/596; 427/126.1; 427/190; 427/203; 427/248.1; 204/192.25
[58] Field of Search ..................... 427/475, 554, 427/586, 596, 527, 126.1, 294, 190, 470, 560, 601, 566, 255.1, 255.2, 248.1, 561, 473, 199, 180, 203; 204/192.25

[56] References Cited

U.S. PATENT DOCUMENTS

| | | | |
|---|---|---|---|
| 3,294,583 | 12/1966 | Fedows-Fedotowsky | 427/527 |
| 4,177,298 | 12/1979 | Shigeta et al. | 427/124 |
| 4,448,632 | 5/1984 | Akasaka | 427/554 |
| 4,463,028 | 7/1984 | Laude | 427/554 |
| 4,474,829 | 10/1984 | Peters | 427/586 |
| 4,550,031 | 10/1985 | Abrokwah | 427/294 |
| 4,713,257 | 12/1987 | Luttermoller | 427/475 |
| 4,808,432 | 2/1989 | Hajek | 427/475 |
| 5,113,473 | 5/1992 | Yoshida et al. | 204/192.52 |

Primary Examiner—Marianne Padgett
Attorney, Agent, or Firm—Ostrolenk, Faber, Gerb & Soffen

[57] ABSTRACT

Disclosed herein is a method of preparing an InSb thin film, which comprises a step of physically sticking InSb powder onto a major surface of a substrate, and a step of depositing an InSb thin film on the major surface of the substrate provided with the as-stuck InSb powder by a method such as vacuum evaporation.

20 Claims, 1 Drawing Sheet

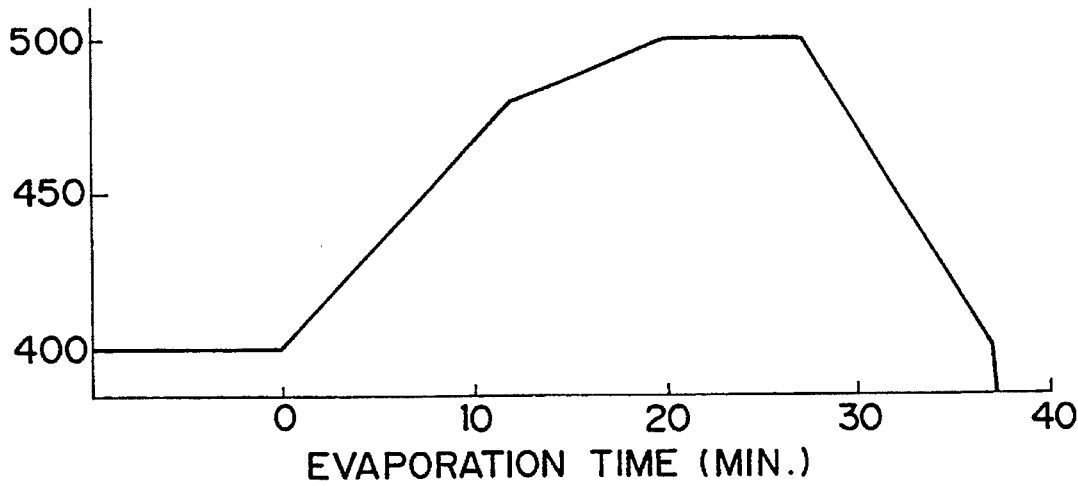
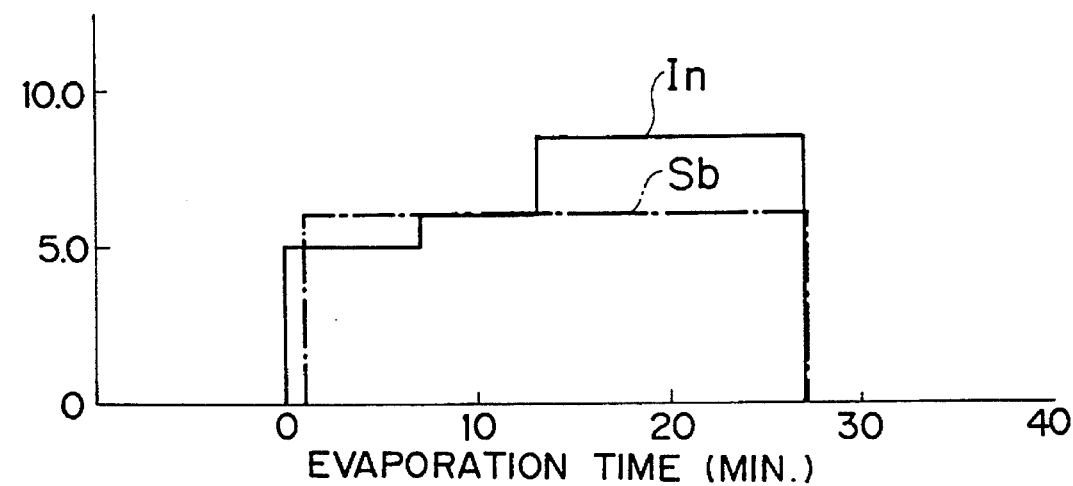

METHOD OF PREPARING INSB THIN FILM

BACKGROUND OF THE INVENTION

1. Field of the Invention

The present invention relates to a method of preparing an InSb thin film, which is applied to a magnetic resistive element, a Hall element or the like.

2. Description of the Background Art

In general, an InSb compound semiconductor is employed as a material for a Hall element or a magnetic resistive element due to its high Hall mobility $\mu$. A magnetic sensor such as the Hall element or the magnetic resistive element must have resistance of several hundred $\Omega$ to several k$\Omega$ in order to improve consistency with a sensor signal processing circuit. However, InSb is a material which has low resistivity of $10^{-8}$ $\Omega$·cm order in essence. When InSb is applied to a Hall element or a magnetic resistive element, therefore, it is necessary to form a thin film. Such formation of a thin film is also required in order to easily form a fine pattern.

In general, an InSb thin film having high mobility is formed on a mica substrate by vacuum evaporation or the like. It is empirically known that mica is the optimum material for a base material for forming a thin film of InSb. While the reason therefor is not yet clarified in detail, it is conceivable that a thin film having small reduction of mobility is formed due to excellent crystallinity of the InSb thin film which is formed on such a mica substrate.

However, it is difficult to work a final element on a mica substrate, which has cleavage in crystal structure. In general, therefore, it is necessary to temporarily form an InSb thin film on mica and transfer this InSb thin film onto a target base material for patterning the same into a prescribed shape.

An InSb film which is formed on a general substrate such as an Si substrate having an $SiO_2$ film, an Si substrate having a film of silicon nitrides, an Si substrate having an $Al_2O_3$ film, a glass substrate, a ferrite substrate, an Si substrate of each crystal plane orientation or a GaAs substrate exhibits mobility of about 10000 to 20000 $cm^2$/V·sec. Therefore, a magnetic resistive element, a Hall element or an infrared detection element which is prepared from such a film is inferior in rate of magnetic resistance change, product sensitivity and photoelectromotive force.

SUMMARY OF THE INVENTION

An object of the present invention is to provide a method of preparing an InSb thin film, which can form an InSb thin film having high mobility on a surface of the aforementioned general substrate.

The method according to the present invention comprises a step of physically sticking InSb powder onto a major surface of a substrate, and a step of depositing an InSb thin film on the major surface of the substrate.

According to the inventive method, InSb powder is first physically stuck onto a major surface of a substrate, and an InSb thin film is then deposited on the major surface of the substrate which is provided with the physically stuck InSb powder. The inventors have found that an InSb thin film having high mobility which is similar to that provided on a mica substrate is formed according to the present invention. It is conceivable that the InSb thin film which is formed on the major surface of the substrate is improved in crystallinity when InSb powder is physically stuck onto the major surface according to the present invention.

The substrate employed in the present invention is not restricted in particular, but generally prepared from an insulating substrate, such as an Si substrate having an $SiO_2$ film, an Si substrate having a film of silicon nitrides, an Si substrate having an $Al_2O_3$ film, a glass substrate, a ferrite substrate, an Si substrate or a GaAs substrate.

According to the present invention, it is possible to form an InSb thin film, having high mobility which is equivalent to that provided on a mica substrate, also on such a general substrate. Therefore, no indirect working such as transfer is required for forming an element such as a Hall element or a magnetic resistive element. Further, any working method can be employed since it is possible to directly form an InSb thin film on a final substrate, whereby pattern accuracy of the as-formed element is improved and the range of its application is widened in response. For example, it is possible to form an InSb thin film on an Si substrate or a thin film which is formed on an Si substrate, whereby a monolithic sensor IC can be easily manufactured.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 illustrates relation between an evaporation time and a substrate temperature in Example of the present invention; and FIG. 2 illustrates relation between an evaporation time and respective evaporation rates for In and Sb in Example of the present invention.

DESCRIPTION OF THE PREFERRED EMBODIMENTS

First Example

InSb polycrystalline powder of 10 $\mu$m in mean particle diameter, which is generally employed as an evaporation source or the like, was placed on a glass substrate. Thereafter gaseous nitrogen was blown to remove an excess part of the InSb powder from the glass substrate. Thus obtained was a glass substrate, which was provided with the InSb powder stuck onto its surface. While the step of placing the InSb powder on the substrate and that of removing the excess part of the InSb powder from the substrate by blowing gaseous nitrogen were carried out once in this Example, each step may be repeated a plurality of times at need.

Then, an InSb thin film was formed on the surface of the glass substrate, which was provided with the as-stuck InSb powder, by vacuum evaporation. In such formation of the thin film, the degree of vacuum was set at $1 \times 10^{-4}$ Pa. The substrate temperature was successively increased stepwise from 400° C. to 500° C., as shown in FIG. 1. As to the evaporation rates, In and Sb were simultaneously evaporated. The evaporation rate for In was successively increased stepwise from 5.0 Å/sec. to 8.0 Å/sec. while that for Sb was set at a constant value of 6.0 Å/sec., as shown in FIG. 2.

Thus, an InSb thin film of 2.0 $\mu$m in thickness was formed on the glass substrate. This InSb thin film was patterned into a Hall element pattern by photolithography. The as-formed pattern of the InSb thin film exhibited mobility of 51200 $cm^2$/V·sec.

While the InSb powder was stuck onto a dry glass substrate by electrostatic force in, the aforementioned Example, the present invention is not restricted to such a sticking method. For example, a substrate may be previously coated with a liquid for forming an SiO₂ coatings, so that InSb powder is stuck onto this coating layer. Then, the liquid coating the substrate may be glassified by firing to fix the InSb powder to the surface of the substrate. An InSb thin film may be deposited on the substrate, onto which the InSb powder is stuck in the aforementioned manner.

Second Example

InSb polycrystalline powder was added into a solution such as ethanol, to prepare a suspension. Then, an Si(100) substrate having an SiO₂ film of 1 μm in thickness was dipped in this suspension, and subjected to application of ultrasonic waves for about 60 minutes in the suspension. Thereafter the substrate was taken out from the suspension, and subjected to ultrasonic cleaning in pure water for 20 minutes and then in a cleaning solution for 20 minutes, respectively. Then, the substrate was baked in a clean oven at 150° C. for about 60 minutes.

An InSb thin film was formed on the substrate, which was pretreated in the aforementioned manner, by molecular beam epitaxy (MBE). Thin film forming conditions were a degree of vacuum of $4.0 \times 10^{-7}$ Pa, a substrate temperature of 400° C., and an evaporation rate Sb/In in a flow velocity ratio of 1.4.

Thus, an InSb thin film of 1 μm in thickness was formed on the substrate. This InSb thin film was patterned into a Hall element pattern by photolithography. The as-obtained pattern of the InSb thin film exhibited mobility of 60500 cm²/V·sec.

While the InSb thin films were deposited by vacuum evaporation and MBE in the aforementioned Examples, the present invention is not restricted to these methods. The InSb thin film may alternatively be deposited by laser ablation, sputtering or the like, for example.

While InSb polycrystalline powder was employed in each of the aforementioned Examples, the InSb powder may alternatively be single-crystalline.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of preparing an InSb thin film, comprising the steps of:

physically sticking InSb powder onto a major surface of a substrate so as to incompletely cover said surface; and depositing an InSb thin film on said major surface of said substrate.

2. A method of preparing an InSb thin film in accordance with claim 1, wherein said sticking step comprises the step of sticking said InSb powder onto said major surface of said substrate by electrostatic force.

3. A method of preparing an InSb thin film in accordance with claim 1, wherein said sticking step comprises the steps of:

dipping said substrate in a suspension containing said InSb powder being dispersed therein, and applying ultrasonic waves to said substrate in said suspension.

4. A method of preparing an InSb thin film in accordance with claim 1, wherein said sticking step comprises the steps of:

dipping said substrate in a suspension containing said InSb powder being dispersed therein, applying ultrasonic waves to said substrate in said suspension, cleaning said major surface of said substrate with ultrasonic waves, and heat-treating said major surface of said substrate.

5. A method of preparing an InSb thin film in accordance with claim 1, wherein said sticking step comprises the steps of:

coating said major surface of said substrate with a liquid for forming an inorganic coating, sticking said InSb powder onto said coated major surface, and forming said inorganic coating on said major surface onto which said InSb powder has been stuck.

6. A method of preparing an InSb thin film in accordance with claim 5, wherein said inorganic coating is an SiO₂ coating.

7. A method of preparing an InSb thin film in accordance with claim 1, wherein said deposition step comprises the step of depositing an InSb thin film by vacuum evaporation.

8. A method of preparing an InSb thin film in accordance with claim 1, wherein said deposition step comprises the step of depositing an InSb thin film by molecular beam epitaxy.

9. A method of preparing an InSb thin film in accordance with claim 1, wherein said deposition step comprises the step of depositing an InSb thin film by laser ablation.

10. A method of preparing an InSb thin film in accordance with claim 1, wherein said deposition step comprises the step of depositing an InSb thin film by sputtering.

11. A method of preparing an InSb thin film in accordance with claim 1, wherein said substrate is selected from the group consisting of an Si substrate having an SiO₂ film, an Si substrate having a film of silicon nitrides, an Si substrate having an Al₂O₃ film, a glass substrate, a ferrite substrate, an Si substrate and a GaAs substrate.

12. A method of preparing an InSb thin film in accordance with claim 1, wherein said InSb powder is polycrystalline powder.

13. A method of preparing an InSb thin film in accordance with claim 1, wherein said InSb powder is single-crystalline powder.

14. A method in accordance with claim 2, wherein said deposition step comprises the step of depositing an InSb thin film by vacuum evaporation.

15. A method in accordance with claim 2, wherein said deposition step comprises the step of depositing an InSb thin film by molecular beam epitaxy.

16. A method in accordance with claim 2, wherein said deposition step comprises the step of depositing an InSb thin film by laser ablation.

17. A method in accordance with claim 2, wherein said deposition step comprises the step of depositing an InSb thin film by sputtering.

18. A method in accordance with claim 2, wherein said substrate is selected from the group consisting of an Si substrate having an SiO₂ film, an Si substrate having a film of silicon nitrides, an Si substrate having an Al₂O₃ film, a glass substrate, a ferrite substrate, an Si substrate and a GaAs substrate.

19. A method in accordance with claim 2, wherein said InSb powder is polycrystalline powder.

20. A method in accordance with claim 2, wherein said InSb powder is single-crystalline powder.

* * * * *